US012658908B2

(12) United States Patent
Bianchi et al.

(10) Patent No.: US 12,658,908 B2
(45) Date of Patent: Jun. 16, 2026

(54) ELECTRONIC CIRCUIT TO VERIFY THE INTEGRITY OF A SWITCH

(71) Applicants: BORGWARNER ORSENIGO S.R.L., Orsenigo (IT); DR. ING. H.C. F. PORSCHE AG, Stuttgart (DE)

(72) Inventors: Ercole Bianchi, Orsenigo (IT); Pasquale Forte, Orsenigo (IT); Paolo Lisanti, Orsenigo (IT)

(73) Assignees: BORGWARNER ORSENIGO S.R.L., Orsenigo (IT); DR. ING. H.C. F. PORSCHE AG, Stuttgart (DE)

( * ) Notice: Subject to any disclaimer, the term of this patent is extended or adjusted under 35 U.S.C. 154(b) by 61 days.

(21) Appl. No.: 18/861,084

(22) PCT Filed: Apr. 28, 2023

(86) PCT No.: PCT/IB2023/054412
§ 371 (c)(1),
(2) Date: Oct. 28, 2024

(87) PCT Pub. No.: WO2023/209653
PCT Pub. Date: Nov. 2, 2023

(65) Prior Publication Data
US 2025/0350272 A1      Nov. 13, 2025

(30) Foreign Application Priority Data

Apr. 29, 2022      (IT) ........................ 102022000008603

(51) Int. Cl.
H03K 17/0812      (2006.01)
H03K 3/356      (2006.01)
H03K 5/24      (2006.01)

(52) U.S. Cl.
CPC ... H03K 17/0812 (2013.01); H03K 3/356017 (2013.01); H03K 5/24 (2013.01)

(58) Field of Classification Search
CPC ......... H03K 17/0812; H03K 3/356017; H03K 5/24; H03K 17/0828; H03K 17/18; G01R 31/3275
(Continued)

(56) References Cited

U.S. PATENT DOCUMENTS

| | | | |
|---|---|---|---|
| 9,093,836 | B2 | 7/2015 | Reiter et al. |
| 10,298,223 | B2 | 5/2019 | Hokazono et al. |
| 2019/0386654 | A1 | 12/2019 | Norling et al. |

FOREIGN PATENT DOCUMENTS

| | | |
|---|---|---|
| CN | 112865767 A | 5/2021 |
| JP | 7037538 B2 | 3/2022 |

OTHER PUBLICATIONS

International Search Report and Written Opinion, mailed Sep. 19, 2023, from PCT App. No. PCT/IB2023/054412, 13 pages.

*Primary Examiner* — Ryan Jager
(74) *Attorney, Agent, or Firm* — Workman Nydegger

(57) ABSTRACT

The disclosure relates to an electronic circuit to verify the integrity of a switch. The circuit comprises a voltage comparator and decoupling switch. The decoupling switch configured receive the driving signal having a first logic value to enable the monitoring of the comparison voltage and is configured to receive the monitoring enable signal having a first logic value to command the opening of the decoupling switch. The electronic circuit is configured to generate the output monitoring signal having a first logic value in an event that the switch is an open circuit and having a second logic value in an event that the switch is a short circuit.

20 Claims, 1 Drawing Sheet

(58) Field of Classification Search
USPC ........................................................ 327/109
See application file for complete search history.

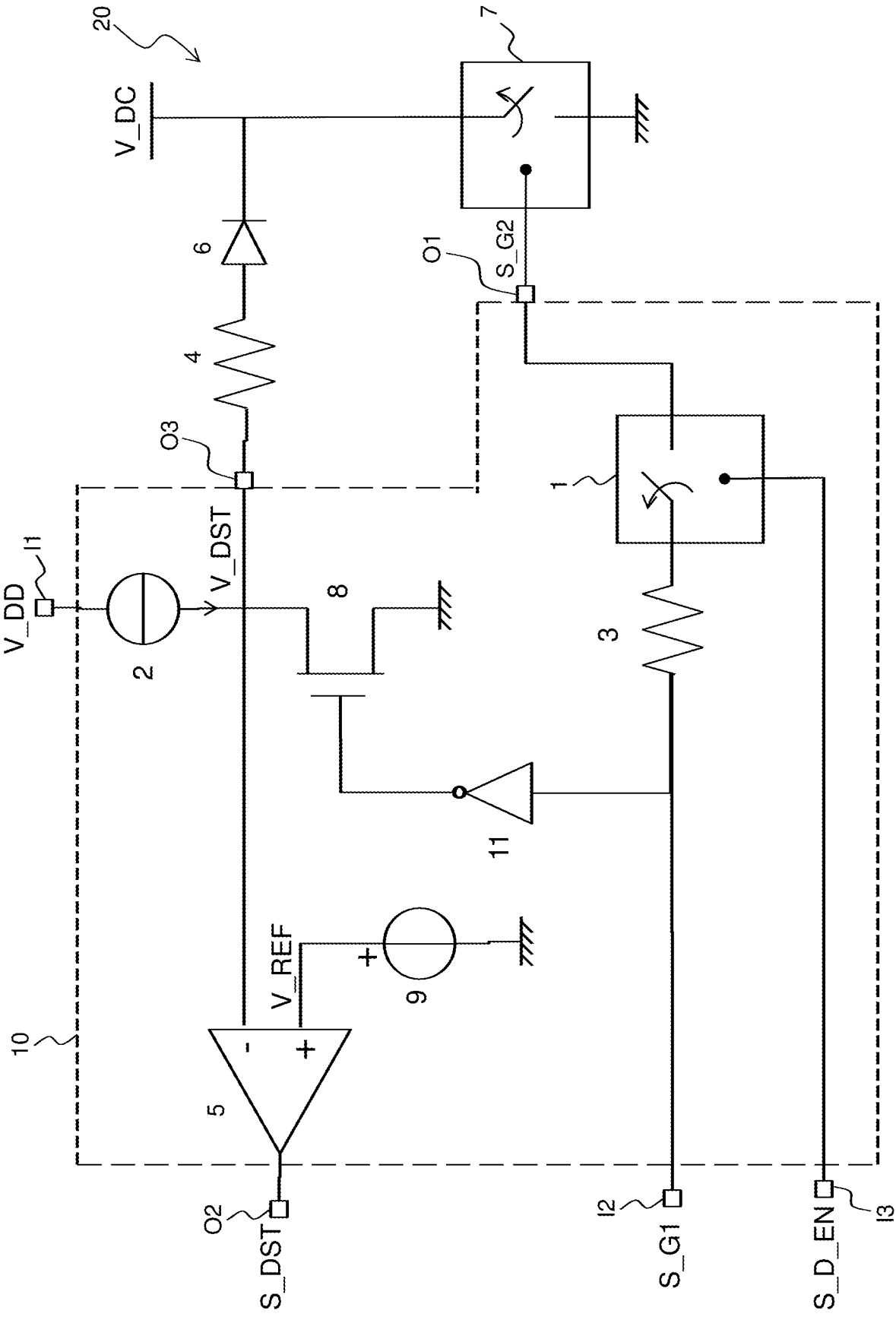

ELECTRONIC CIRCUIT TO VERIFY THE INTEGRITY OF A SWITCH

BACKGROUND

Technical Field

The present disclosure generally relates to the field of electronics.

More specifically, the present disclosure concerns an electronic circuit for verifying the integrity of a switch.

Description of the Related Art

Switches are known to be used to disconnect a supply voltage for safety reasons.

For example, in the automotive field it is important to disconnect a supply voltage of a battery charger mounted on an electric vehicle, in the event of faults occurring in the components of the battery charger supplied by this supply voltage.

A known technique for monitoring the condition of switches is to use the desaturation function of semiconductor-type switches, which makes it possible to detect if an increase in the current flowing through the switch increases excessively due to faults in the electronic components supplied by the same supply voltage: in this case, the switch can be opened in such a way as to prevent the increase in its current from damaging the switch.

The Applicant noted that a disadvantage of the desaturation function is that it is not able to detect a short circuit of the switch, thus preventing the switch from opening and causing failures of electronic components connected downstream of the switch or injecting unwanted currents into the power source (e.g. direct current from a battery to the mains supply).

BRIEF SUMMARY

The present disclosure relates to an electronic circuit to verify the integrity of a switch as defined in the appended claim 1 and by embodiments thereof described in the appended dependent claims.

The Applicant has perceived that the electronic circuit according to the present disclosure can detect the condition of short circuit of a switch interposed between a supply voltage and the electronic components supplied therefrom, thereby reducing the risk of damaging the electronic components or injecting unwanted currents into the power source.

The basic idea is to use an additional switch connected to the control terminal of the switch and controlled as a function of a monitoring enable signal, so as to verify whether the switch is in the condition of short-circuit, for example before it is connected to the supply voltage.

One embodiment of the present disclosure is an electronic power supply system, wherein the electronic power supply system is defined in the appended claim 9 and in the embodiment described in the appended dependent claim 10.

BRIEF DESCRIPTION OF THE SEVERAL VIEWS OF THE DRAWINGS

Further features and advantages of the disclosure will result from the following description of an embodiment and variations thereof provided by way of example with reference to the accompanying drawings, wherein:

FIG. 1 shows a block diagram of an electronic power supply system comprising an electronic circuit to verify the integrity of a switch according to one embodiment of the disclosure.

DETAILED DESCRIPTION

It should be noted that in the following description identical or similar blocks, components or modules are shown in the FIGURES with the same numerical references, even though they are shown in different embodiments of the disclosure.

With reference to FIG. 1, a power electronics system 20 is shown according to one embodiment of the disclosure.

The electronic power system 20 is used, for example, to power a battery charger mounted on board an electric vehicle.

The electronic system 20 comprises a switch 7, an electronic circuit 10, a resistor 4 and a diode 6.

For the purposes of the explanation of the disclosure, a protective switch 7 is considered, but more generally the disclosure can be applied to verify the integrity of any type of switch.

The switch 7 includes a first terminal adapted to receive a supply voltage V_DC of any value, includes a second terminal connected to a ground reference voltage and includes a control terminal adapted to receive an output driving signal S_G2 which commands the switch 7 to switch between an open position and a closed position, as a function of the value of the output driving signal S_G2 itself.

Switch 7 is for example an IGBT transistor or MOSFET.

The electronic circuit 10 comprises a first input terminal 11 adapted to receive a supply voltage VDD, comprises a second input terminal 12 adapted to receive a driving signal S_G1, comprises a third input terminal 13 adapted to receive a monitoring enable signal S_D_EN, comprises a first output terminal O1 adapted to generate the output driving signal S_G2 for driving the opening or closing of the switch 7, comprises a second output terminal O2 adapted to generate an output monitoring signal S_DST representative of a condition of the switch 7 and comprises a third output terminal O3 for generating a comparison voltage V_DST.

A series connection of resistor 4 and diode 6 is interposed between the third output terminal O3 and the first terminal of switch 7 connected to the supply voltage V_DC.

In particular, the resistor 4 comprises a first terminal connected to the third output terminal O3 and a second terminal connected to the anode terminal of the diode 6.

The diode 6 has its cathode terminal connected to the first terminal of the switch 7 (and thus connected to the supply voltage V_DC).

The electronic power supply system 20 is configured to operate according to two operation modes:

a test mode;

a normal operating mode subsequent to the test mode.

The test mode is activated before the electronic system 20 is supplied with the supply voltage V_DC.

In particular, in the test mode the integrity of the switch 7 is verified, that is its ability to switch correctly between a condition wherein the switch 7 is open and a condition wherein the switch 7 is closed.

In particular, in the test mode it is verified whether a short circuit (i.e., low impedance) of the switch 7 is present, by means of the decoupling switch 1 which is kept open by means of a first value (e.g., a high logic value) of the monitoring enable signal S_D_EN.

In the normal operating mode, the switch 7 is closed in order to transfer electrical energy from the supply voltage V_DC to the electrical/electronic components powered by it (e.g., a battery charger mounted on an electric vehicle) and is monitored in the event of a desaturation condition of switch 7 occurring, as a result of an overcurrent or incorrect driving of the switch 7.

Specifically, in the normal operating mode the decoupling switch 1 is kept closed by means of the monitoring enable signal S_D_EN having a second value (e.g., a low logic value) and the switch 7 is also kept closed by means of the driving signal S_G1 having a first value (e.g., a high logic value).

The electronic circuit 10 comprises the following components:

a voltage comparator 5 the decoupling switch 1;

a resistor 3;

a current generator 2;

a voltage generator 9;

a transistor 8, e.g. of the MOSFET type a voltage inverter 11.

The combination of the voltage comparator 5, current generator 2, voltage generator 9, transistor 8 and voltage inverter 11 implement, during the normal operating mode, a desaturation function to detect the presence of an overcurrent flowing through switch 7, caused, for example, by failures or malfunctions of electrical or electronic components powered by the supply voltage V_DC.

The decoupling switch 1 has the function to allow to verify whether switch 7 is in the condition of short circuit (i.e. low impedance), for example before it is connected to the supply voltage V_DC.

The electrical and electronic components of the electronic circuit 10 are electrically connected as shown in FIG. 1.

In particular, the current generator 2 comprises a first terminal connected to the supply voltage VDD and a second terminal connected to the voltage comparator 5.

The voltage comparator 5 includes a negative terminal connected to the second terminal of the current generator 2 and includes a positive terminal connected to a reference voltage V_REF (for example, equal to 7 volts).

The voltage comparator 5 can also be implemented with an operational amplifier.

The reference voltage V_REF is generated, for example, by the voltage generator 9 connected between the positive terminal of the voltage comparator 5 and a reference voltage to ground.

The transistor 8 (for example, an n-channel MOSFET) comprises a first terminal connected to the negative terminal of the voltage comparator 5 and the second terminal of the current generator 2 and comprises a second terminal connected to the reference voltage to ground.

The negative terminal of the voltage comparator 5, the second terminal of the current generator 2 and the first terminal of the transistor 8 are connected together to form the third output terminal O3 of the electronic circuit 10 carrying the comparison voltage V_DST.

The voltage inverter 11 comprises a first terminal adapted to receive the driving signal S_G1 and comprises a second terminal connected to the control terminal of the transistor 8.

The voltage inverter 11 is implemented, for example, with a NOT logic gate.

The decoupling switch 1 comprises a first terminal connected to the resistor 3, comprises a second terminal connected to the control terminal of the switch 7 (and thus connected to the first output terminal O1) and comprises a control terminal adapted to receive the monitoring enable signal S_D_EN from the third input terminal 13.

Resistor 3 is interposed between the second input terminal 12 and the first terminal of the decoupling switch 1.

The output monitoring signal S_DST has two functions:

during the normal operation of the electronic power supply system 20, the output monitoring signal S_DST is indicative of the presence or absence of a switch desaturation state 7;

during a test phase (typically prior to normal operation), the output monitoring signal S_DST is indicative of the presence or absence of a closed condition (that is short circuit) of the switch 7, or the output monitoring signal S_DST is indicative of the presence or absence of an open condition of the switch 7.

The following truth table shows the possible values of the driving signal S_G1, monitoring enable signal S_D_EN, condition of open (high impedance) or closed (short-circuit, that is low impedance) of the switch 7, output monitoring signal S_DST and condition of safe/failure of the switch 7:

| S_G1 [logic value] | S_D_EN [logic value] | Switch 7 open | S_DST [logic value] | Condition of switch 7 |
|---|---|---|---|---|
| Low | X | X | High | X |
| High | Low | FALSE | High | failure |
| High | Low | TRUE | Low | safe |
| High | High | FALSE | High | safe |
| High | High | TRUE | Low | failure |

The following behaviour can be observed in the table:

first line: the logic value of the driving signal S_G1 is low and the system 20 operates in the normal operating mode;

second and third rows: when the logic value of the driving signal S_G1 is high and the logic value of the monitoring enable signal S_D_EN is low, the decoupling switch 1 is driven so as to be open and the electronic system 20 is able to detect whether the switch 7 is correctly open, by means of the output monitoring signal S_DST having an high or low logic value (condition of failure or safe of the switch 7, respectively);

fourth and fifth rows: when the logic value of the driving signal S_G1 is high and the logic value of the monitoring enable signal S_D_EN is high, the decoupling switch 1 is driven so as to be closed and the electronic system 20 is able to detect whether the switch 7 is correctly closed, by means of the output monitoring signal S_DST having an high or low logic value (condition of safe or failure of the switch 7, respectively).

In other words, if during the test phase the switch 7 is driven so as to be closed and the switch 7 is really closed, the switch 7 operates correctly (fourth row of the table); differently, if the switch 7 is driven so as to be closed and the switch 7 remains open, the switch 7 has a failure (fifth row of the table).

Analogously, if during the test phase the switch 7 is driven so as to be open and the switch 7 is really open, the switch 7 operates correctly (third row of the table); differently, if the switch 7 is driven so as to be open and the switch 7 remains closed, the switch 7 has a failure (second row of the table).

During the normal operation of the electronic power supply system 20, the decoupling switch 1 is closed and the switch 7 is closed and a small voltage drop occurs at the ends of the switch 7; moreover, a current having a limited value (for example, equal to 10 amperes) flows through the switch 7.

The current generator 2 generates a current having a defined value (for example, equal to 200 microAmpere) and this current flows through the resistor 4, the diode 6 (which is in the conduction state) and the switch 7 towards the reference voltage at ground: an appropriate voltage value (for example, equal to 3 Volts) of the comparison voltage V_DST is then generated at the negative terminal of the voltage comparator 5.

In the event that there are no faults or malfunctions of the components supplied by the supply voltage V_DC, the voltage comparator 5 detects that the reference voltage V_REF on its positive terminal is greater than the comparison voltage V_DST on its negative terminal, and then generates the output monitoring signal S_DST having a high logic value representative of a correct operation of the electrical and/or electronic components supplied by the supply voltage V_DC.

On the other hand, in the event of a failure or malfunction of one or more of the components supplied by the supply voltage V_DC, the desaturation condition of the switch 7 occurs: the current flowing through the resistor 4 and the diode 6 increases to a high value, the voltage drop at the ends of the switch 7 increases (desaturation condition) and thus the value of the comparison voltage V_DST on the negative terminal of the voltage comparator (i.e. the voltage of the third output terminal O3) also increases.

Accordingly, the voltage comparator 5 detects that the reference voltage V_REF on its positive terminal is lower than the comparison voltage V_DST on its negative terminal and thus generates the output monitoring signal S_DST having a low logic value representative of a malfunction of one or more of the electrical and/or electronic components supplied by the supply voltage V_DC.

The output monitoring signal S_DST can thus be used (e.g. by a processing unit) to control the opening of the switch at 7, thus preventing it from being damaged.

During the test operation of the electronic power supply system 20, the driving signal S_G1 is activated (logic high state), transistor 8 is open (i.e. it is in the high-impedance state), and the comparison voltage monitoring V_DST is enabled: the decoupling switch 1 is open or closed, as a function of the value of the monitoring enable signal S_D_EN.

In the event that switch 7 is open (i.e. it is in a high-impedance state), transistor 8 is open and thus current generator 2 causes an increase in the comparison voltage V_DST.

Consequently, the voltage comparator 5 detects that the comparison voltage V_DST on its negative terminal is greater than the reference voltage V_REF on its positive terminal and thus generates the output monitoring signal S_DST having a switch from a high logic value to a low logic value representative of an open condition (i.e. of correct operation) of the switch 7 (third row of the table).

On the other hand, in the event that switch 7 is in a short-circuit condition (i.e. it is closed, i.e. it is in a low-impedance state), the current generated by current generator 2 flows through resistor 4, diode 6 and switch 7 (which is short-circuited), so that the comparator voltage V_DST remains at a lower value than the reference voltage V_REF.

Consequently, the voltage comparator 5 detects that the reference voltage V_REF on its positive terminal is greater than the voltage on its negative terminal and thus it generates the output monitoring signal S_DST having a high logic value representative of a short circuit (i.e. low impedance) of the switch 7 (fourth row of the table).

Therefore during the test mode it is possible to verify the integrity of the switch 7 both when it is open (second and third row of the table) and when it is closed (that is short-circuit, fourth and fifth row of the table), differently form the prior art circuits based on the desaturation which do not allow to detect when the switch 7 is open.

It should be noted that for the purposes of the explanation of the disclosure, the case in which the decoupling switch 1 is included within the electronic circuit 10 has been considered, but an embodiment in which the decoupling switch 1 is external to the electronic circuit 10 is also possible.

It should also be noted that for the purposes of explaining the disclosure, certain logic states for the signals have been considered (for example, the driving signal S_G1 with high active logic), but it is also possible to use different active logic states without changing the essence of the operation.

Finally, it should be noted that in the test mode it is possible to wait for a sufficient time so that the signals can reach the stationary values, before evaluating the condition of integrity of the switch 7.

The invention claimed is:

1. An electronic circuit to verify an integrity of a switch, the electronic circuit comprising:

a first input terminal adapted to receive a power supply voltage;

a second input terminal adapted to receive a driving signal;

a third input terminal adapted to receive a monitoring enable signal;

a first output terminal adapted to generate an output control signal to drive an opening or closing of the switch;

a second output terminal adapted to generate an output monitoring signal representative of a condition of the switch;

a voltage comparator configured to compare a comparison voltage associated with a terminal of the switch connected to a further power supply voltage with respect to a reference voltage and to generate therefrom the output monitoring signal; and a decoupling switch interposed between the first output terminal and the second input terminal, the decoupling switch being configured to switch between an open position and a closed position as a function of a value of the monitoring enable signal;

wherein the decoupling switch is configured to:

receive the driving signal having a first logic value to enable the monitoring of the comparison voltage; and receive the monitoring enable signal having a first logic value to command the opening of the decoupling switch;

wherein the voltage comparator is configured to generate the output monitoring signal having a first logic value in an event that the switch is open and having a second logic value in an event that the switch is closed.

2. The electronic circuit according to claim 1, wherein the decoupling switch is configured to:

receive the driving signal having a first logic value to enable the monitoring of the comparison voltage; and receive the monitoring enable signal having a second logic value to command the closing of the decoupling switch; and wherein the voltage comparator is configured to generate the output monitoring signal having the second logic value in the event that the switch is closed and having the first logic value in the event that the switch is open.

3. The electronic circuit according to claim 2, wherein the decoupling switch comprises:

an input terminal electrically coupled with the second input terminal;

an output terminal electrically connected to a control terminal of the switch;

a control terminal adapted to receive the monitoring enable signal.

4. The electronic circuit according to claim 3, further comprising a resistor interposed between the second input terminal and the decoupling switch.

5. The electronic circuit according to claim 3, further comprising:

a current generator having a first terminal adapted to receive the power supply voltage and having a second terminal connected to a first terminal of the voltage comparator;

a transistor having a first terminal connected to the first terminal of the voltage comparator and with the second terminal of the current generator, having a second terminal connected to a ground reference voltage and having a control terminal electrically coupled with an input terminal of the decoupling switch.

6. The electronic circuit according to claim 2, further comprising a resistor interposed between the second input terminal and the decoupling switch.

7. The electronic circuit according to claim 2, further comprising:

a current generator having a first terminal adapted to receive the power supply voltage and having a second terminal connected to a first terminal of the voltage comparator;

a transistor having a first terminal connected to the first terminal of the voltage comparator and with the second terminal of the current generator, having a second terminal connected to a ground reference voltage and having a control terminal electrically coupled with an input terminal of the decoupling switch.

8. The electronic circuit according to claim 7, wherein:

the transistor is configured to receive the driving signal having a first logic value to enable the monitoring of the comparison voltage and the transistor is open;

in the event that the switch is open, the voltage comparator is configured to detect that the comparison voltage on one of its negative terminals is greater than the reference voltage on its positive terminal, and the voltage comparator is configured to generate the output monitoring signal having the first logic value indicative of the open circuit of the switch;

in an event of a short circuit of the switch, the current generated by the current generator flows through the switch, and the voltage comparator is configured to detect that the comparison voltage on one of its negative terminals is less than the reference voltage on its positive terminal, and the voltage comparator is configured to generate the output monitoring signal having the second logic value indicative of the short circuit of the switch.

9. The electronic circuit according to claim 1, wherein the decoupling switch comprises:

an input terminal electrically coupled with the second input terminal;

an output terminal electrically connected to a control terminal of the switch; and a control terminal adapted to receive the monitoring enable signal.

10. The electronic circuit according to claim 9, further comprising a resistor interposed between the second input terminal and the decoupling switch.

11. The electronic circuit according to claim 9, further comprising:

a current generator having a first terminal adapted to receive the power supply voltage and having a second terminal connected to a first terminal of the voltage comparator;

a transistor having a first terminal connected to the first terminal of the voltage comparator and with the second terminal of the current generator, having a second terminal connected to a ground reference voltage and having a control terminal electrically coupled with an input terminal of the decoupling switch.

12. The electronic circuit according to claim 11, wherein:

the transistor is configured to receive the driving signal having a first logic value to enable the monitoring of the comparison voltage and the transistor is open;

in the event that the switch is open, the voltage comparator is configured to detect that the comparison voltage on one of its negative terminals is greater than the reference voltage on its positive terminal, and the voltage comparator is configured to generate the output monitoring signal having the first logic value indicative of the open circuit of the switch;

in the event of a short circuit of the switch, the current generated by the current generator flows through the switch, and the voltage comparator is configured to detect that the comparison voltage on one of its negative terminals is less than the reference voltage on its positive terminal, and the voltage comparator is configured to generate the output monitoring signal having the second logic value indicative of the short circuit of the switch.

13. The electronic circuit according to claim 1, further comprising a resistor interposed between the second input terminal and the decoupling switch.

14. The electronic circuit according to claim 1, further comprising:

a current generator having a first terminal adapted to receive the power supply voltage and having a second terminal connected to a first terminal of the voltage comparator;

a transistor having a first terminal connected to the first terminal of the voltage comparator and with the second terminal of the current generator, having a second terminal connected to a ground reference voltage and having a control terminal electrically coupled with an input terminal of the decoupling switch.

15. The electronic circuit according to claim 14, wherein:

the transistor is configured to receive the driving signal having a first logic value to enable the monitoring of the comparison voltage and the transistor is open;

in the event that the switch is open, the voltage comparator is configured to detect that the comparison voltage on one of its negative terminals is greater than the reference voltage on its positive terminal, and the voltage comparator is configured to generate the output monitoring signal having the first logic value indicative of the open circuit of the switch;

in an event of a short circuit of the switch, the current generated by the current generator flows through the switch, and the voltage comparator is configured to detect that the comparison voltage on one of its negative terminals is less than the reference voltage on its positive terminal, and the voltage comparator is configured to generate the output monitoring signal having the second logic value indicative of the short circuit of the switch.

16. The electronic circuit according to claim 15, further comprising:

a voltage inverter having an input terminal connected to the second input terminal and an output terminal connected to the control terminal of the transistor;

a resistor having a first terminal connected to the second input terminal and a second terminal connected to the input terminal of the decoupling switch.

17. The electronic circuit according to claim 14, further comprising:

a voltage inverter having an input terminal connected to the second input terminal and an output terminal connected to the control terminal of the transistor;

a resistor having a first terminal connected to the second input terminal and a second terminal connected to the input terminal of the decoupling switch.

18. The electronic circuit according to claim 1, wherein the decoupling switch is implemented with a MOSFET transistor or with a bipolar junction transistor.

19. An electronic power supply system comprising:

a switch interposed between a power supply voltage and a ground reference voltage, the switch being configured to switch between an open position and a closed position as a function of a value of an output control signal;

an electronic circuit configured to verify an integrity of the switch, the circuit comprising:

a first input terminal adapted to receive a power supply voltage;

a second input terminal adapted to receive a driving signal;

a third input terminal adapted to receive a monitoring enable signal;

a first output terminal adapted to generate an output control signal to drive the opening or closing of the switch;

a second output terminal adapted to generate an output monitoring signal representative of a condition of the switch;

a voltage comparator configured to compare a comparison voltage associated with a terminal of the switch connected to a further power supply voltage with respect to a reference voltage and to generate therefrom the output monitoring signal;

a decoupling switch interposed between the first output terminal and the second input terminal, the decoupling switch being configured to switch between an open position and a closed position as a function of the value of the monitoring enable signal;

wherein the decoupling switch is configured to:

receive the driving signal having a first logic value to enable the monitoring of the comparison voltage; and receive the monitoring enable signal having a first logic value to command the opening of the decoupling switch;

wherein the voltage comparator is configured to generate the output monitoring signal having a first logic value in an event that the switch is open and having a second logic value in an event that the switch is closed;

wherein the first output terminal of the electronic circuit is connected to a control terminal of the switch adapted to receive the output control signal;

wherein the electronic circuit further comprises a third output terminal connected to the voltage comparator and adapted to generate said comparison voltage, the third output terminal being electrically coupled with a switch terminal, wherein the electronic system is configured to operate according to two operating modes:

a test mode, in which the decoupling switch is driven so as to be open or closed as a function of the value of the monitoring enable signal and the electronic circuit is configured to generate the output monitoring signal indicative of the open or closed switch;

a normal operating mode, in which the decoupling switch is closed and the switch is closed and the electronic circuit is configured to generate the output monitoring signal indicative of a normal operating state of the switch or indicative of an overcurrent condition through the switch.

20. The electronic power supply system according to claim 19, further comprising a series connection of a resistor and of a diode which are interposed between the third output terminal and the switch terminal.

\* \* \* \* \*